United States Patent
Schell et al.

(10) Patent No.: US 8,050,352 B2
(45) Date of Patent: Nov. 1, 2011

(54) METHODS AND APPARATUS FOR REDUCING PEAK-TO-RMS AMPLITUDE RATIO IN COMMUNICATION SIGNALS

(75) Inventors: Stephan V. Schell, Santa Mateo, CA (US); Richard W. D. Booth, San Jose, CA (US)

(73) Assignee: Panasonic Corporation, Osaka (JP)

( * ) Notice: Subject to any disclaimer, the term of this patent is extended or adjusted under 35 U.S.C. 154(b) by 662 days.

(21) Appl. No.: 12/172,786

(22) Filed: Jul. 14, 2008

(65) Prior Publication Data

US 2008/0304594 A1    Dec. 11, 2008

Related U.S. Application Data

(63) Continuation-in-part of application No. 12/042,689, filed on Mar. 5, 2008, now Pat. No. 7,639,098.

(60) Provisional application No. 60/906,931, filed on Mar. 14, 2007.

(51) Int. Cl.
*H04K 1/02* (2006.01)
*H04L 25/03* (2006.01)
*H04L 25/49* (2006.01)

(52) U.S. Cl. ........ 375/296; 375/298; 375/300; 375/302; 375/268; 375/271; 375/285; 332/112; 332/145; 332/149

(58) Field of Classification Search .......... 375/296–298, 375/268, 271, 300, 302, 285; 332/103, 112, 332/115, 144, 149, 145
See application file for complete search history.

(56) References Cited

U.S. PATENT DOCUMENTS

| | | | | |
|---|---|---|---|---|
| 6,041,082 | A * | 3/2000 | Takeda et al. | 375/300 |
| 6,931,240 | B2 * | 8/2005 | Hunton | 455/130 |
| 6,987,417 | B2 * | 1/2006 | Winter et al. | 330/10 |
| 7,054,385 | B2 * | 5/2006 | Booth et al. | 375/300 |
| 7,068,984 | B2 * | 6/2006 | Mathe et al. | 455/126 |
| 7,358,829 | B2 * | 4/2008 | Oka | 332/145 |
| 7,535,310 | B2 * | 5/2009 | Shimizu et al. | 332/103 |
| 7,595,702 | B2 * | 9/2009 | Maeda | 332/103 |
| 7,688,157 | B2 * | 3/2010 | Biedka et al. | 332/149 |
| 7,715,808 | B2 * | 5/2010 | Shimizu et al. | 455/108 |
| 7,755,443 | B2 * | 7/2010 | Osman et al. | 332/144 |
| 7,778,612 | B2 * | 8/2010 | Shimizu et al. | 455/114.3 |
| 7,840,193 | B2 * | 11/2010 | Hara et al. | 455/102 |
| 7,915,969 | B2 * | 3/2011 | Shimizu et al. | 332/103 |
| 2002/0193085 | A1 * | 12/2002 | Mathe et al. | 455/126 |
| 2005/0281360 | A1 * | 12/2005 | Booth et al. | 375/346 |
| 2007/0247253 | A1 * | 10/2007 | Carey et al. | 332/112 |
| 2009/0004981 | A1 * | 1/2009 | Eliezer et al. | 455/127.1 |
| 2009/0009243 | A1 * | 1/2009 | McCune, Jr. | 330/1 R |
| 2009/0023402 | A1 * | 1/2009 | Shimizu et al. | 455/102 |

(Continued)

*Primary Examiner* — Jean B Corrielus

(57) ABSTRACT

A pulse amplitude modulation (PAM) signal generator that injects a copy of a pulse into the PAM baseband signal prior to frequency upconversion and power amplification. The pulse comprises a function of, or an extra copy of, a pulse in the PAM baseband signal. The pulse injector analyzes the PAM baseband signal for times when a predetermined threshold is exceeded and forms a pulse that is constructed and arranged to reduce the amplitude of the PAM baseband signal to a desired peak amplitude when the pulse is added to the PAM baseband signal. In other embodiments the peak-to-RMS amplitude ratio reducing methods and apparatus used to process PAM signal are adapted for reducing peak-to-RMS amplitude ratios of amplitude modulation signals in polar modulation transmitters. Peak-to-RMS amplitude ratio reduction is performed in the quadrature domain, the polar domain, or both the quadrature and polar domains.

15 Claims, 15 Drawing Sheets

U.S. PATENT DOCUMENTS

2009/0108952 A1* 4/2009 Shimizu et al. ............... 332/151
2009/0252255 A1* 10/2009 Lee et al. ...................... 375/297
2010/0009641 A1* 1/2010 Osman et al. .................. 455/102
2010/0290562 A1* 11/2010 Jensen et al. .................. 375/300

* cited by examiner

METHODS AND APPARATUS FOR REDUCING PEAK-TO-RMS AMPLITUDE RATIO IN COMMUNICATION SIGNALS

CROSS-REFERENCE TO RELATED APPLICATIONS

This application is a continuation-in-part of U.S. application Ser. No. 12/042,689, filed Mar. 5, 2008, now U.S. Pat. No. 7,639,098 which claims the benefit of U.S. Provisional Application No. 60/906,931, filed Mar. 14, 2007, the disclosures of which are incorporated by reference.

FIELD OF THE INVENTION

The present invention relates to pulse amplitude modulation and, more particularly, to a pulse amplitude modulation (PAM) signal generator capable of reducing the peak-to-RMS amplitude ratio of communication signals without spectral degradation.

BACKGROUND OF THE INVENTION

Many modern communication systems transmit messages using signals having amplitudes that vary significantly over time. Typically, the power capability of the output device in the transmitter (e.g. the final amplifier) must be selected to accommodate the peak amplitude, or perhaps the amplitude at the $99^{th}$ percentile, below which 99% of the amplitudes in the signal occur, or perhaps at the $99.9^{th}$ percentile as another example. In other words, the selection of the output device is governed as much (or more so) by the peak-power requirement as it is by the average power requirement, where the average power is typically the measurement specified directly in the specification document for a communication system. The selection of the output device is governed as much (or more so) by the peak-amplitude requirement as it is by the RMS-amplitude requirement. Therefore, the output device selection requires tradeoffs between accurate reproduction of the signal on the one hand (hereinafter referred to as "communication quality") and, on the other hand, power efficiency, power consumption, size of the output device, etc. (hereinafter referred to as "device efficiency").

Improving the output device efficiency, especially the power efficiency, is highly desirable since transmitters (such as those found in battery operated cellular telephone) have a limited battery source to operate the device. Additionally, improving the device efficiency is beneficial for transmitters constrained by their cooling means, so that thermal damage to the device (e.g., handheld transmitters operating with high duty cycle, or high-power transmitters in base stations in cellular telephone systems) can be prevented. For these applications and others, it is desirable to minimize the ratio between the peak amplitude (or $99^{th}$ percentile or $99.9^{th}$ percentile) and the root-mean-square (RMS) amplitude, in order to facilitate efficient power transmission.

One conventional approach to power-efficient transmission is a so-called linear amplifier that operates in a partially linear and partially nonlinear mode, characterized by a phenomenon known as amplitude compression. In this mode, a small input amplitude A gives rise to a larger output amplitude $$B = gA$$

where g is the small-signal gain of the amplifier. As the input amplitude A increases, the actual gain of the amplifier decreases below g. Thus, the corresponding output amplitude B is not quite as large as it should be. In other words, the amplifier output is not truly proportional to the input. This effectively reduces the peak-to-RMS ratio, which in turn has the benefits of power-efficiency previously described.

A major disadvantage of the linear amplifier approach is that it degrades the signal quality. Typically, some amount of signal quality degradation is accepted in a system design, in exchange for slightly improved power efficiency or reduced heat dissipation. Nonetheless, the conventional (linear amplifier) approach degrades both standard measures of quality, namely an in-band quality measure and an out-of-band quality measure. The in-band quality measure is the RMS error vector magnitude (EVM). A mathematically related measure is RHO which is the normalized cross-correlation coefficient between the transmitted signal and its ideal version. The EVM and RHO relate to the ease with which an intended receiver can extract the message from the transmitted signal. As the EVM increases above zero, or RHO decreases below one, the transmitted signal becomes increasingly distorted compared to the ideal signal. This distortion increases the likelihood that the receiver will make errors while extracting the message.

The out-of-band quality measure is the power spectral density (PSD) of the transmitted signal, or some measure derived therefrom. Of particular interest in the PSD is the degree to which the transmitted signal interferes with other radio channels. In a wireless communications network, to minimize interference with other radio channels, the overall capacity of the network is reduced or limited (e.g., the number of simultaneous users is reduced or limited).

Therefore, any means of reducing the peak-to-RMS ratio must create as little interference as possible (minimal degradation to out-of-band signal quality) while simultaneously maintaining the in-band measure of signal quality (i.e., EVM or RHO) at an acceptable level. The conventional (linear amplifier) approach degrades both out-of-band signal quality and in-band signal quality to reduce peak-to-RMS ratio. In fact, for some signals the conventional (linear amplifier) approach is unable to maintain acceptable quality while delivering the required average power.

In view of the foregoing, it would be desirable to have a PAM signal generator that reduces the peak-to-RMS amplitude ratio of a communications signal to facilitate efficient power transmission and delivery of required average power, while preserving out-of-band signal quality.

It would also be desirable to have a PAM signal generator that modifies pulse amplitude modulated signals to reduce the peak-to-RMS amplitude ratio of the signals without degrading the power spectral density (PSD) of the signals and while simultaneously maintaining the in-band measure of signal quality (i.e., EVM or RHO) at acceptable levels.

SUMMARY OF THE INVENTION

Methods and apparatus for reducing the peak-to-RMS (Root Mean Square) amplitude ratio of communication signals are disclosed. According to an exemplary embodiment, a pulse amplitude modulated (PAM) signal generator includes a modulator operable to modulate a signal with a PAM baseband signal, and a pulse injector operable to form a pulse and add the formed pulse into the PAM baseband signal at a time interval in which an amplitude of the PAM baseband signal exceeds a predetermined threshold, to create a modified baseband signal.

According to an exemplary method, a pulse or an extra copy of a pulse of a PAM baseband signal is generated to modify the PAM baseband signal to reduce the peak-to-RMS amplitude ratio without substantially degrading the power spectral density (PSD) of the signal.

An exemplary method for generating a pulse amplitude modulated (PAM) signal is also disclosed. The method includes modulating a signal with a PAM baseband signal; forming a pulse that is a copy of a pulse in the PAM baseband signal; and adding the formed pulse into the PAM baseband signal at a time interval in which an amplitude of the PAM baseband signal exceeds a predetermined threshold, to create a modified baseband signal.

According to other embodiments of the invention, peak-to-RMS amplitude ratio reduction is used to reduce the modulation bandwidths of amplitude and/or angle modulation signals in polar modulation transmitters. Various examples of performing peak-to-RMS amplitude ratio reduction in the quadrature domain, the polar domain, and both the quadrature and polar domains are disclosed.

Other features and advantages of the present invention will be understood upon reading and understanding the detailed description of the preferred exemplary embodiments, found hereinbelow, in conjunction with reference to the drawings, a brief description of which are provided below.

DETAILED DESCRIPTION

Figure 1:
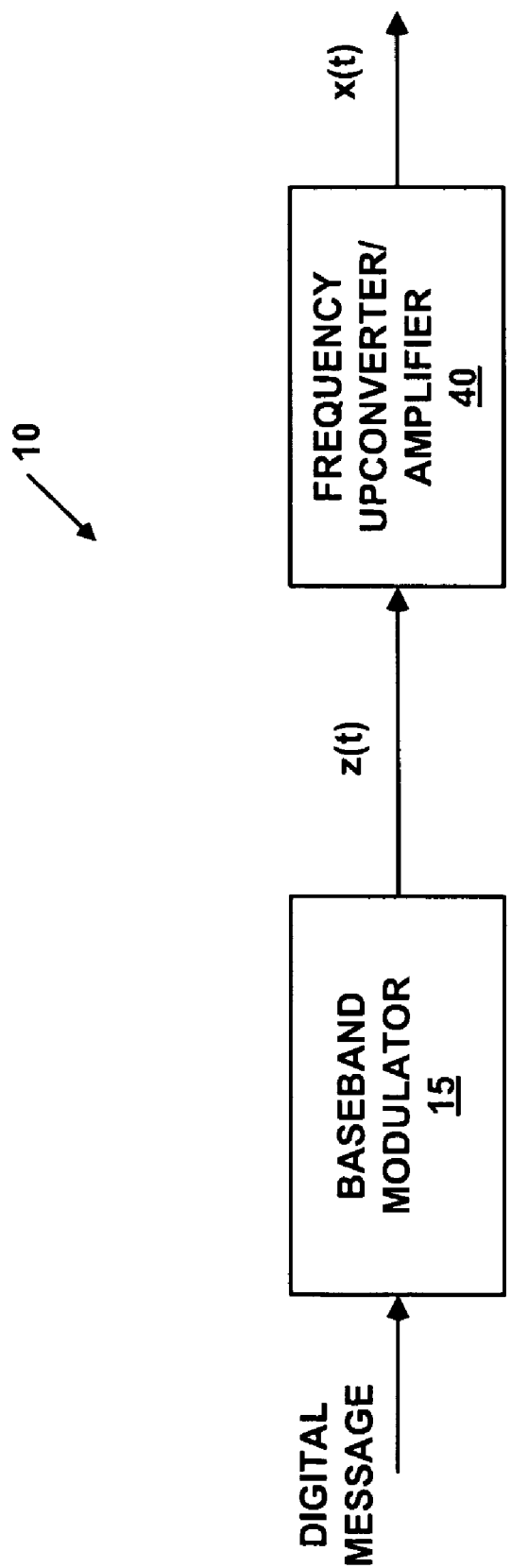
FIG. 1 is a block diagram of a conventional pulse amplitude modulation (PAM) signal generator.

FIG. 1 is a block diagram of a conventional pulse amplitude modulation (PAM) signal generator 10, which is well known in the prior art. Many modern communication systems transmit digital messages using a scheme called pulse amplitude modulation (PAM). A PAM signal is a frequency-upconverted sum of amplitude-scaled, phase-shifted, and time-shifted versions of a single pulse. The amplitude-scaling and phase-shifting of the $n^{th}$ time-shifted version of the pulse are determined by the $n^{th}$ component of the digital message.

In the field of communications systems, the broad class of PAM signals includes signals commonly referred to as PAM, quadrature amplitude modulation (QAM) and phase shift keying (PSK), and many variants recognized by those skilled in the art of communications theory. The PAM signal is generated in two parts, namely a baseband modulation process and a frequency-upconversion and amplification process, as illustrated in FIG. 1.

Referring still to FIG. 1, a digital message is modulated by baseband modulator 15 to form a modulated baseband signal z(t). The modulated baseband signal z(t) is then subjected to frequency upconversion and amplification by a frequency upconverter/amplifier 40 to produce output signal x(t) to be transmitted. The frequency-upconversion and amplification process is described mathematically by equation Eq. (1)

$$x(t) = Re\{gz(t)e^{j\omega_c t}\} \qquad \text{Eq. (1)}$$

where Re { } denotes that real part of its complex argument; $\omega_c = 2\pi f_c$ defines the radio carrier frequency in radians per second; j is the imaginary square-root of negative unity; and, g is the amplifier gain. Equation Eq. (1) describes the frequency-upconversion process used to frequency-upconvert and amplify the complex baseband signal z(t), which is also called I/Q (inphase/quadrature) representation of the signal.

The modulated baseband signal z(t) created by the baseband modulator 15 is defined mathematically by Equation Eq. (2)

$$z(t) = \sum_n a_n p(t - nT) \qquad \text{Eq. (2)}$$

where p(t) is the pulse at time t; T is the symbol period (1/T is the symbol rate). For any time instant t at which z(t) is desired, the summation is taken over all values of n at which p(t−nT) is non-negligible. Also, $a_n$ is the symbol corresponding to the $n^{th}$ component of the digital message. The symbol $a_n$ can be either real or complex, and can be obtained from the $n^{th}$ component of the digital message by means of either a fixed mapping or a time-variant mapping. An example of a fixed mapping occurs for quadrature phase shift key (QPSK) signals, in which the $n^{th}$ component of the digital message is an integer $d_n$ in the set $\{0, 1, 2, 3\}$, and the mapping is given by $a_n=\exp(j\pi d/2)$. An example of a time-variant mapping occurs for $\pi/4$-shifted QPSK which uses a modified QPSK mapping given by $a_n=\exp(j\pi(n+2d_n)/4)$; that is, the mapping depends on the time-index n, not only on the message value $d_n$.

Referring now to the present invention, an important property of a PAM signal is that the shape of the PSD of a PAM (as a function of frequency) signal is determined exclusively by the pulse p(t), under the assumption that the symbol sequence $a_n$ has the same second-order statistical properties as white noise. Moreover, the signal z(t) can be thought of as the output of a filter having an impulse response p(t) and being driven by a sequence of impulses with weights $a_n$. Accordingly, the PSD $S_x(f)$ of the output signal x(t) can be shown to be equal to mathematical equation Eq. (3)

$$S_x(f) = \frac{g^2 \sigma_a^2}{4T}(|P(f-f_c)|^2 + |P(f+f_c)|^2) \qquad \text{Eq. (3)}$$

where P(f) is the Fourier transform of the pulse p(t); and $\sigma_a^2$ is the mean-square value of the symbol sequence.

In view of the foregoing observation, it has been determined that adding extra copies of the pulse p(t) into the modulated baseband signal z(t) does not alter the shape of the PSD. As a result, adding extra copies of the pulse p(t) can be used to reduce the amplitude of the output signal x(t) as desired, such as when it would exceed some threshold.

In accordance with the present invention, the modulated baseband signal z(t) is modified by adding additional pulses thereto, to form new signals y(t) and ξ(t) defined by equations Eq. (4) and Eq. (5), respectively, $$y(t) = \sum_n a_n p(t-nT) + \sum_m b_m p(t-t_m) \qquad \text{Eq. (4)}$$

and $$\xi(t) = Re\{gy(t)e^{j\omega_c t}\}. \qquad \text{Eq. (5)}$$

The perturbation instances $t_m$ represent optimal times at which extra copies of the pulse p(t) are added to the modulated baseband signal z(t) to reduce the peak-to-RMS amplitude ratio of the signal. In other words, the perturbation instances $t_m$ define points in time at which it is desired to perturb the modulated baseband signal z(t) (e.g., whenever the amplitude of x(t) (or z(t)) exceeds some predetermined threshold). The threshold can be set based on any suitable criteria. For example, it may be set based on out-of-band spectral distortion limits specified by a desired adjacent channel leakage ratio (ACLR) or a desired adjacent channel power ratio (ACPR) and/or on in-band signal fidelity requirements specified by a desired EVM or RHO. The perturbation sequence $b_m$ represents the amplitude-scaling and phase-shifting to be applied to the pulse centered at time $t_m$ (e.g., chosen so as to reduce the amplitude of x(t) in the vicinity of time $t_m$). Like the first term in the modulated baseband signal y(t), the second term in y(t) can be thought of as the output of a filter having impulse response p(t) and being driven by a sequence of impulses with weights $b_m$. Thus, one can reasonably expect that the PSDs of ξ(t) and x(t) will have very similar shapes (as a function of frequency).

Figure 2:
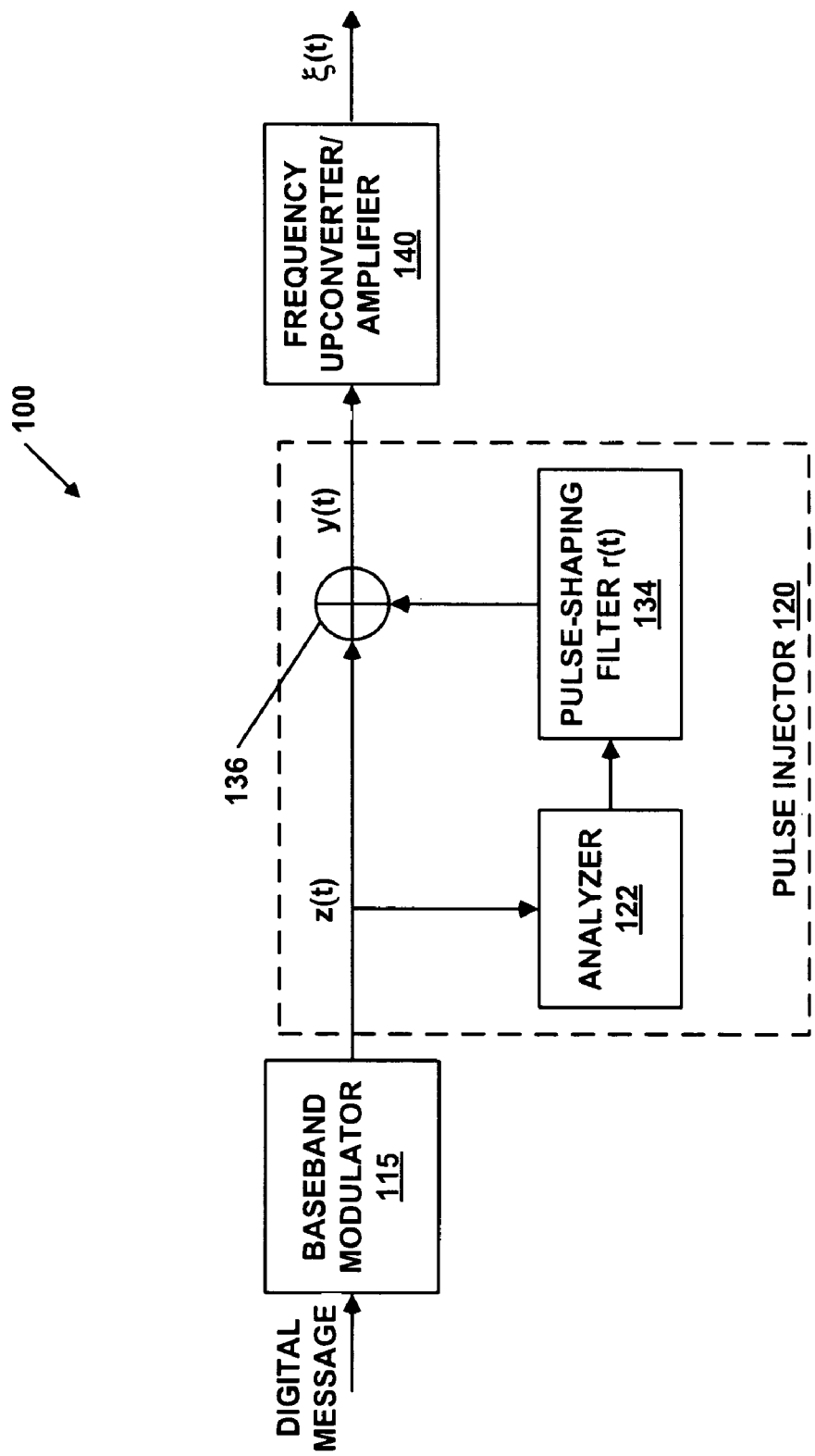
FIG. 2 is a block diagram of a PAM signal generator, according to an embodiment of the present invention.

Referring now to FIG. 2, there is shown a block diagram of a PAM signal generator 100, according to an embodiment of the present invention. The PAM signal generator 100 includes a baseband modulator 115 that outputs a modulated baseband signal z(t). The modulated baseband signal z(t) is coupled to an input of a pulse injector 120, which is operable to add a pulse to the modulated baseband signal z(t) at time intervals in which the signal amplitude exceeds a predetermined threshold to create a modified baseband signal y(t). The modulated baseband signal z(t) passes into analyzer 122, which determines appropriate perturbation instances $t_m$, and outputs a perturbation sequence value $b_m$ at time instant $t_m$. The perturbation sequence value $b_m$ passes through a pulse-shaping filter 134 having an impulse response r(t), the output of which is added to the modulated baseband signal z(t), via adder 136, to produce the modified baseband signal y(t). The modified baseband signal y(t) is passed to a frequency upconverter/amplifier 140 or any appropriate means for frequency upconversion. The impulse response r(t) of the pulse-shaping filter 134 can be identical to the original pulse p(t), as described above, or it can be different from p(t) (e.g., it may be a truncated version of p(t) to simplify implementation).

Figure 3:
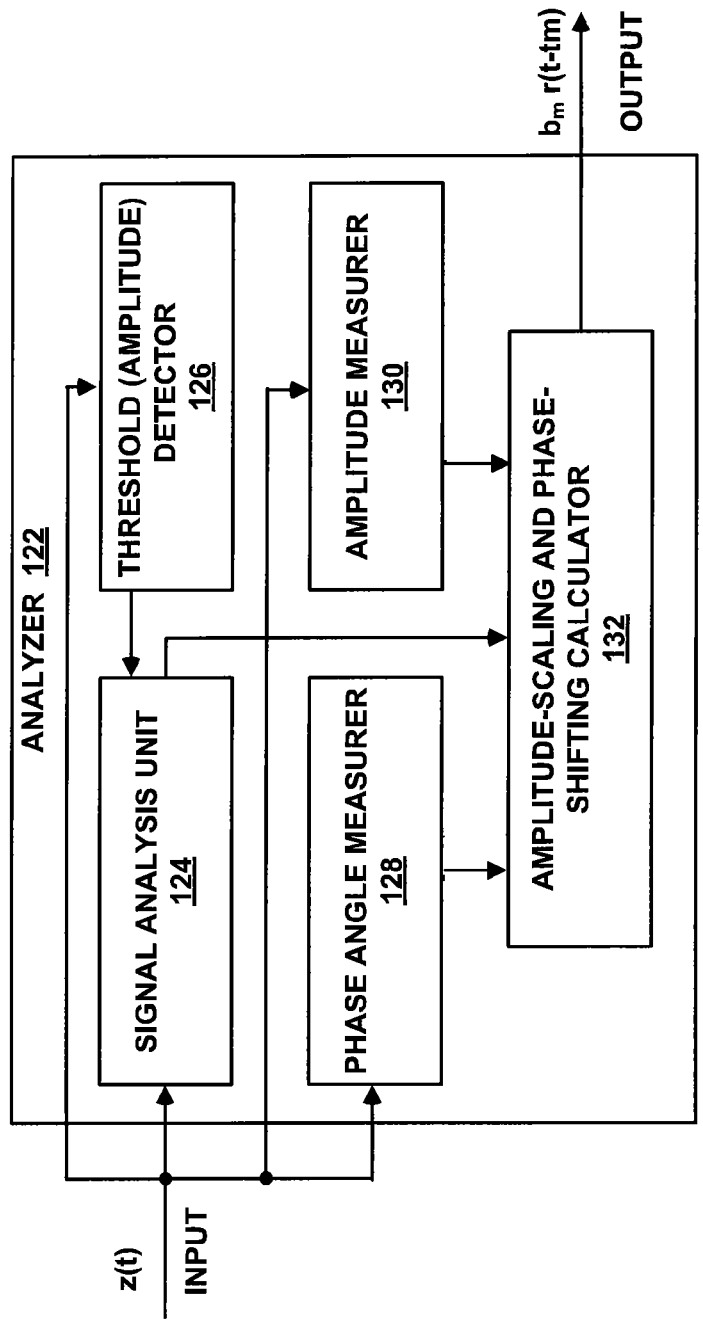
FIG. 3 is a block diagram of an analyzer and a modulated baseband signal z(t)
Figure 4:
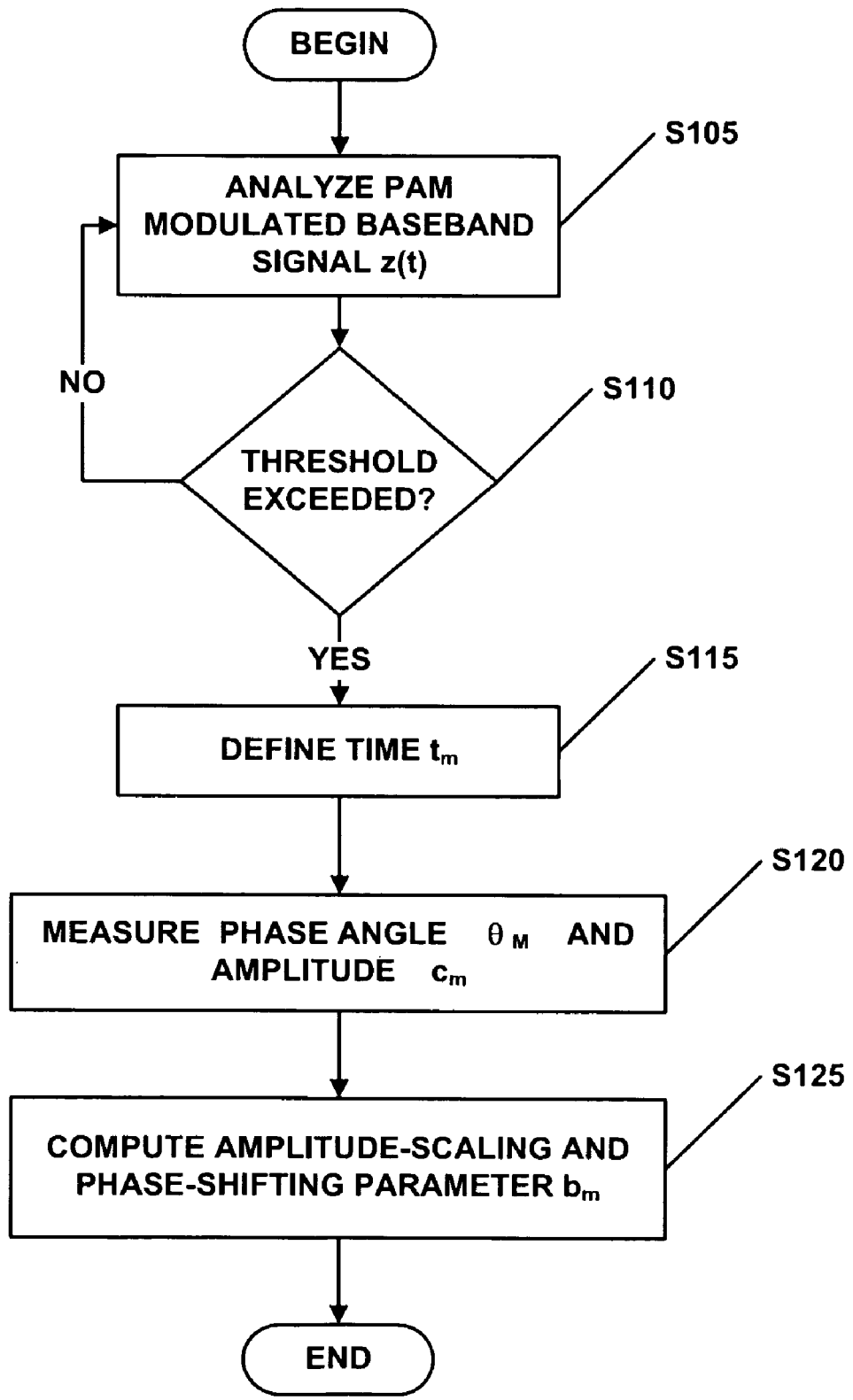
FIG. 4 is a flow chart of steps for providing the modulated baseband signal in the vicinity of a peak-amplitude event.

Referring now to FIGS. 3 and 4, an exemplary embodiment of the analyzer 122 and it's method of operation are shown. The analyzer 122 includes a signal analysis unit 124, a threshold (amplitude) detector 126, phase angle measurer 128, amplitude measurer 130 and amplitude-scaling and phase-shifting calculator 132. In operation, beginning with step S105, the signal analysis unit 124 receives, as input, and observe the modulated baseband signal z(t). The threshold detector 126 detects, at step S110, when (the time) the threshold is exceeded in the modulated baseband signal z(t) to define the time $t_m$, at step S115. At step S120, the analyzer 122 then measures the phase angle $\theta_m$ via phase angle measurer 128 and amplitude $c_m$ via amplitude measurer 130 of the modulated baseband signal z(t) at the point $t_m$. Thereafter, the analyzer 122 computes the amplitude-scaling and phase-shifting parameter $b_m$ via amplitude-scaling and phase-shifting calculator 132, at step S125.

According to one embodiment, $b_m$ is calculated using equation Eq. (6)

$$b_m=(d-c_m)\exp(j\theta_m) \qquad \text{Eq. (6)}$$

where d is the desired peak amplitude.

Assuming that the pulse-shaping filter 134 has a peak amplitude equal to unity, adding the signal $b_m r(t-t_m)$ to z(t) reduces the peak amplitude from $c_m$ to the desired peak amplitude d.

Figure 5:
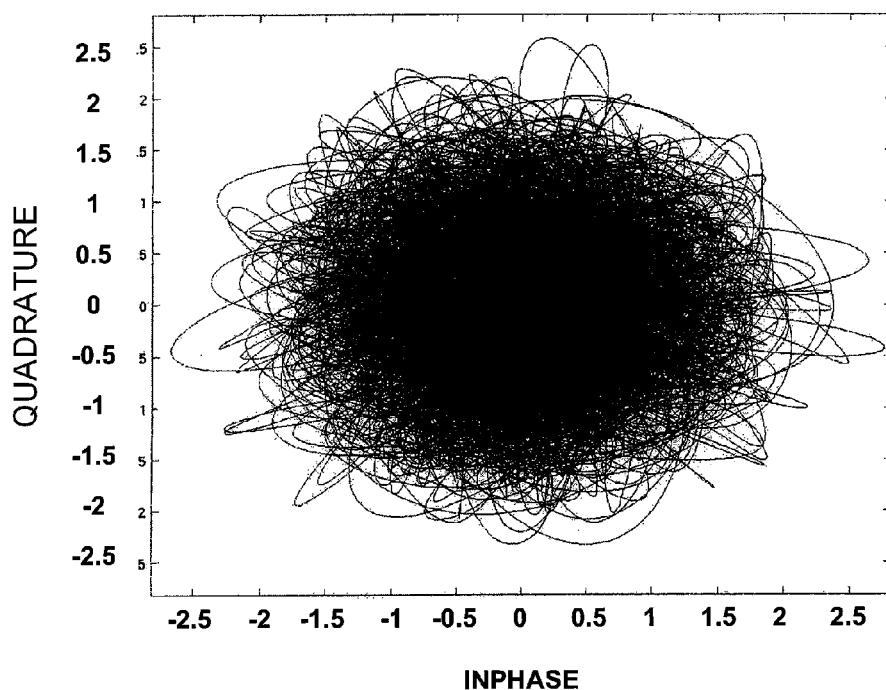
FIG. 5 is a vector diagram of a modified baseband signal y(t) in the vicinity of the peak-amplitude event in FIG. 4, illustrating how the PAM generator in FIG. 2 operates to reduce the peak-to-RMS amplitude ratio of the modulated based band signal.

Referring now to FIG. 5, a vector signal diagram of an unperturbed modulated baseband signal z(t) is illustrated. The vector signal diagram plots the quadrature (imaginary) part of the modulated baseband signal z(t) versus the in-phase (real) part of the signal over a long period of time. The measured peak-to-RMS ratios at various percentiles are summarized in Table 1.

TABLE 1

Peak-to-RMS Ratio at Percentiles of Interest for IS-95 Reverse Channel Signal Having Multiple Supplementary Code Channels

| Percentile (%) | 99 | 99.9 | 99.99 | 100 |
|---|---|---|---|---|
| Peak-to-RMS (dB) | 6.5 | 8.1 | 8.8 | 9 |

Figure 6:
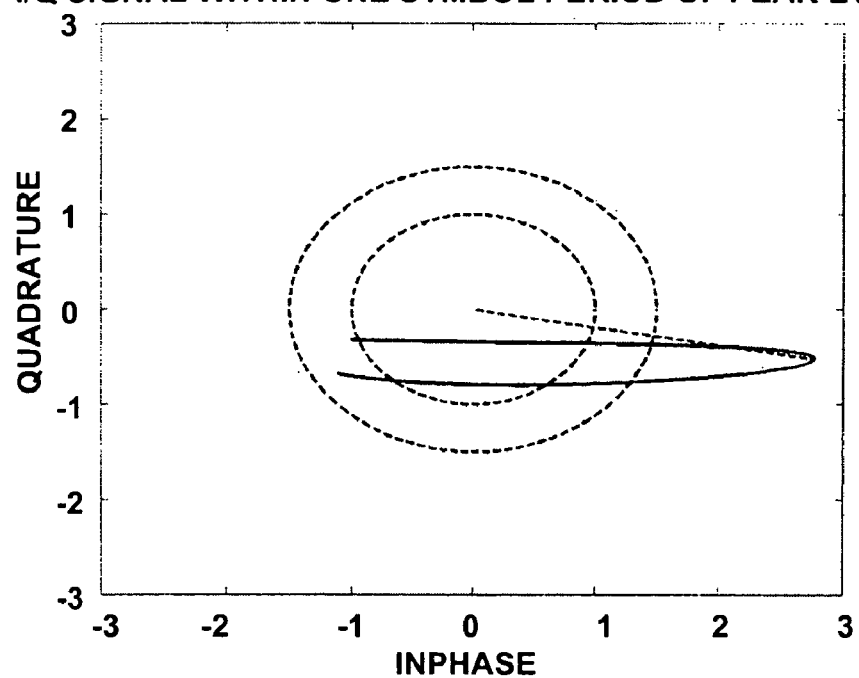
FIG. 6 is a graph of the out-of-band signal quality PSDs of the baseband and modified baseband signals z(t) and y(t)

FIG. 6 is a vector diagram of the modulated baseband signal z(t) during a brief time interval when the signal is near its maximum amplitude. The solid line depicts the signal during a brief time interval. The inner dashed circle represents the RMS value of the signal over all time. The outer dashed circle indicates the desired peak amplitude. The dashed line emanating from the origin intersects the signal at its point of maximum amplitude. In this example, the desired peak amplitude is 1.5 times the RMS value.

Figure 7:
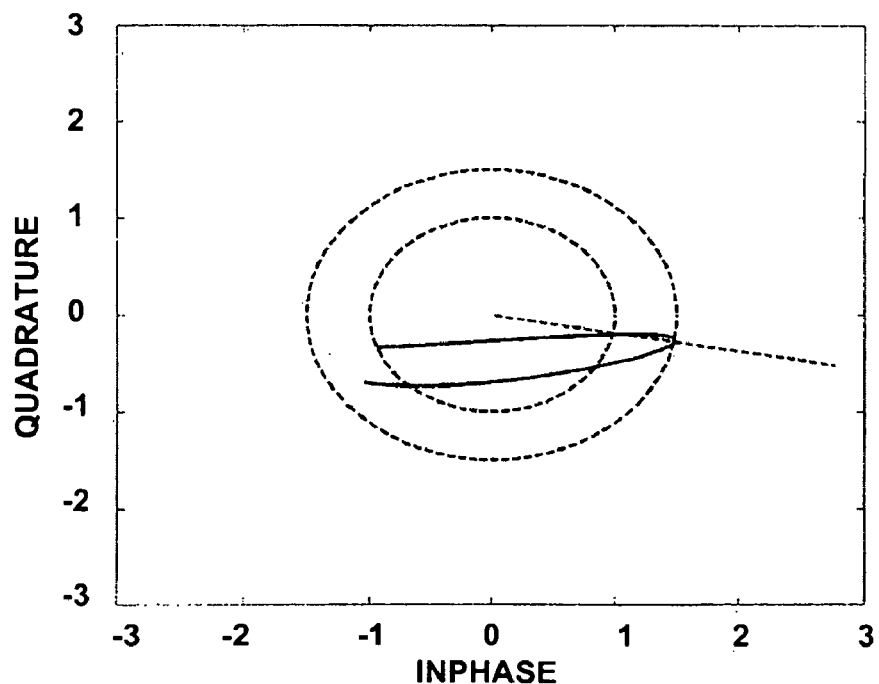
FIG. 7 is a graph of the in-band signal quality measure RHO versus amplitude threshold that illustrates how the peak-to-RMS amplitude reduction apparatus and methods of the present invention do not substantially degrade in-band signal quality.
Figure 8:
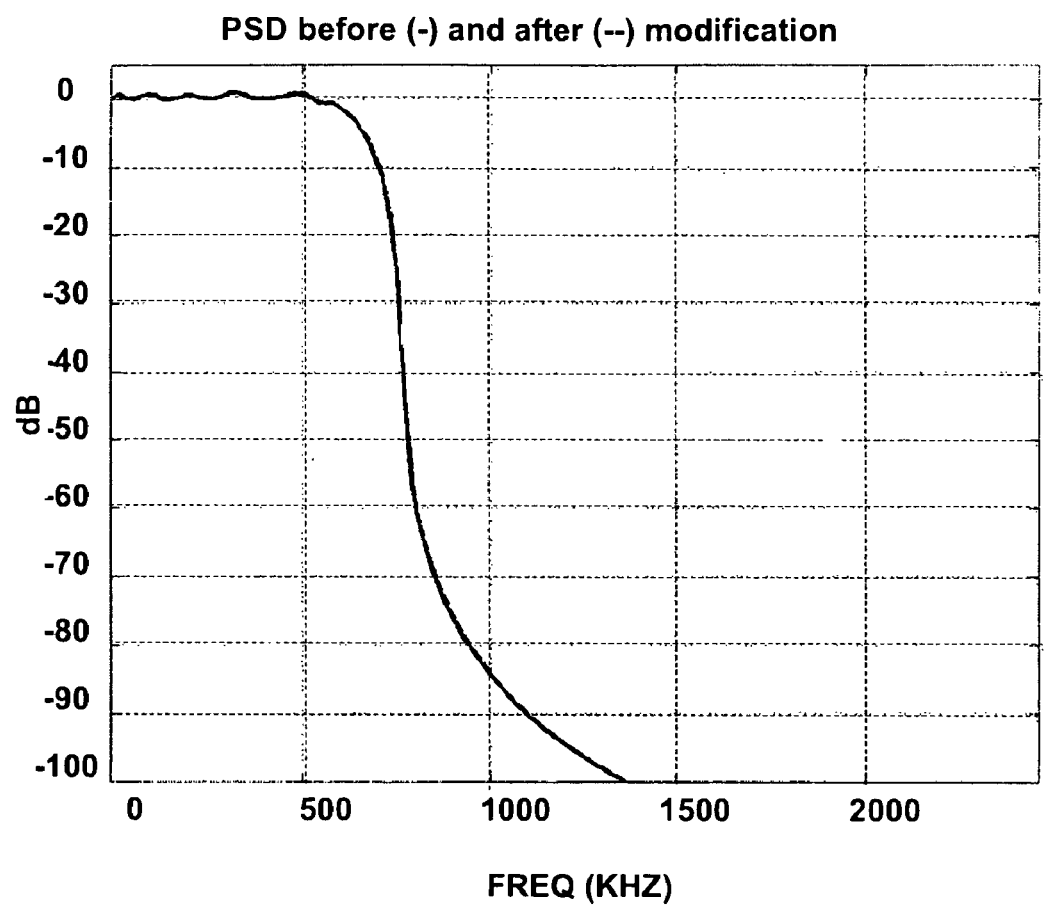
FIG. 8 is a graph of peak-to-RMS amplitude ratios versus amplitude threshold values for various in-band signal quality measures.

If the pulse-shaping filter 134 has a peak amplitude equal to unity, adding the signal $b_m r(t-t_m)$ to z(t) reduces the peak amplitude from $c_m$ to the desired peak amplitude d and the modified baseband signal y(t) is shown in FIG. 7. Clearly, the peak amplitude of the modified baseband signal y(t) is now below the desired peak amplitude as indicated by the outer dashed circle. The dashed line emanating from the origin indicates the location of the peak-amplitude event in z(t) prior to peak reduction. After processing about 4000 symbols with the invention in this example, the out-of band signal quality of the modified baseband signal y(t) can be measured using the PSD, as shown in FIG. 8 where it is overlaid with the PSD of the original modulated baseband signal z(t). The two PSDs have such similar shapes that it is difficult to distinguish between the two. This demonstrates the capability of the present invention to maintain out-of-band signal quality.

Figure 9:
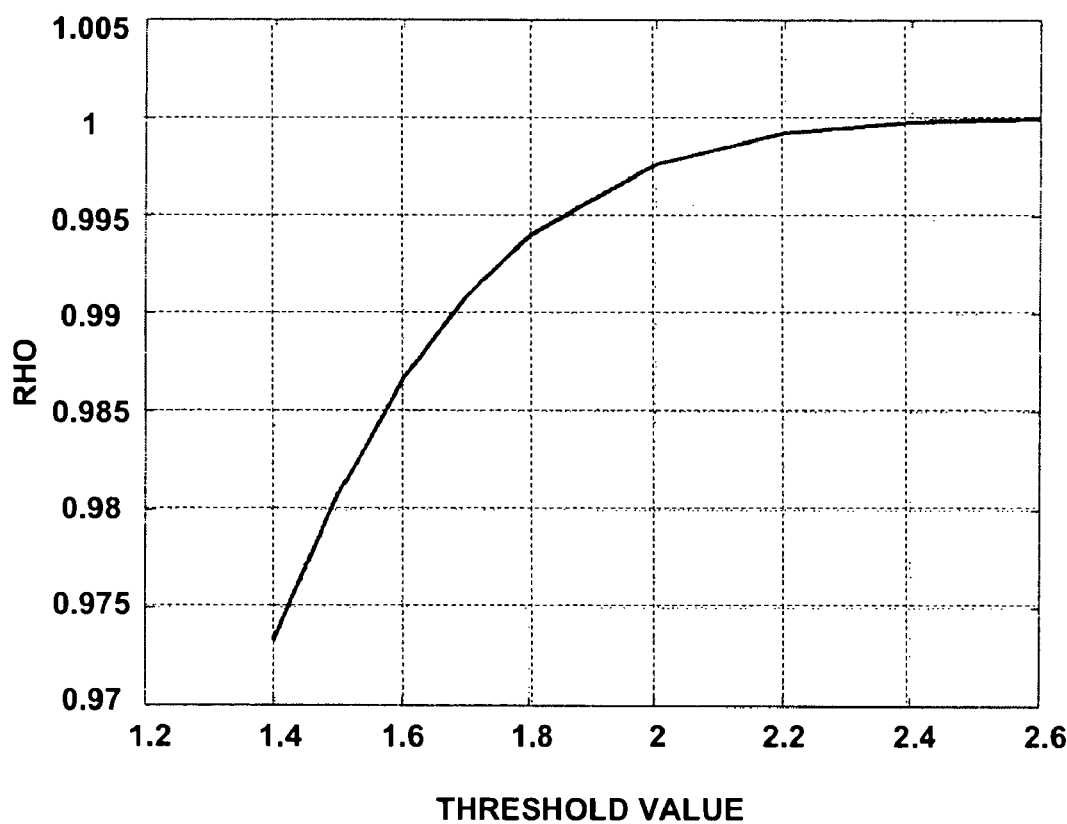
FIG. 9 is a of chart of the effect of the analyzer of the PAM signal generator in FIG. 2, in accordance with embodiments of the present invention.

FIG. 9 illustrates the effect the PAM generator 100 of the present invention has on the in-band signal quality measure RHO. As d decreases, RHO decreases, indicating worsening in-band signal quality. In this example, the specification for RHO in the IS-95 standard is that RHO must exceed 0.94, over the range of desired peak amplitudes. For the range of desired peak amplitudes considered here, the in-band signal quality is shown to be in compliance with the specification.

Figure 10:
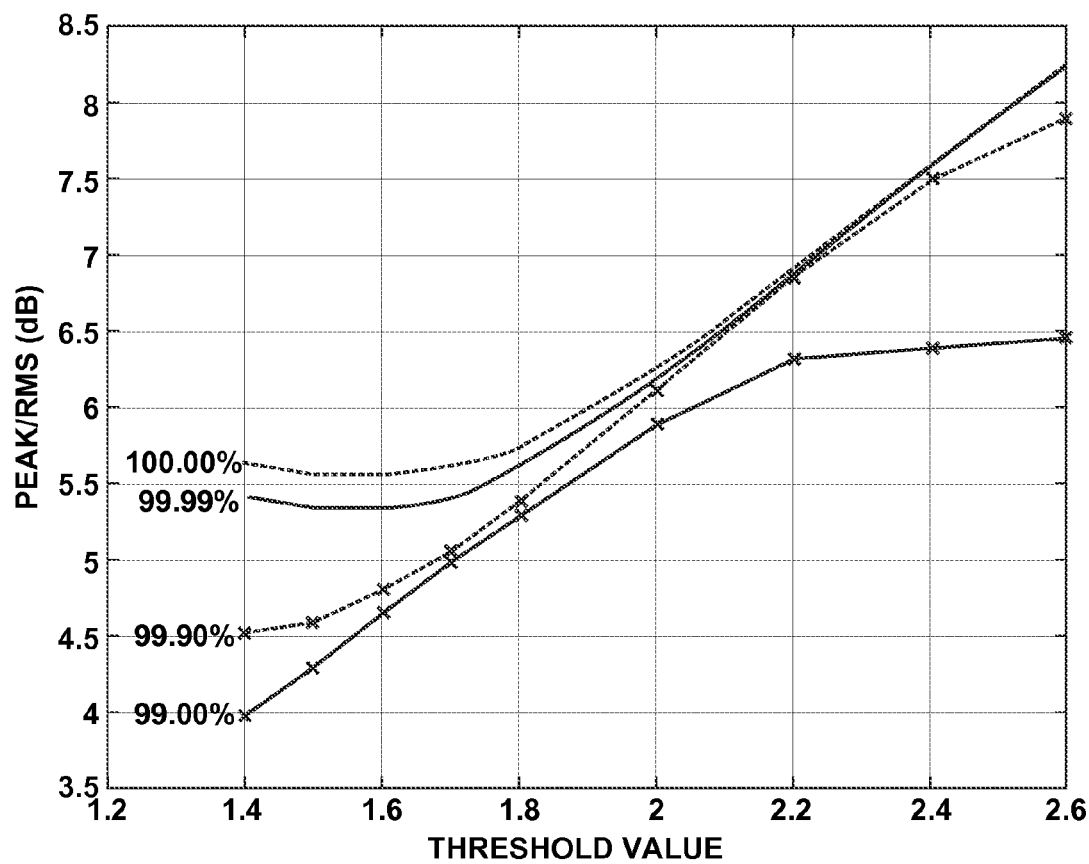
FIG. 10 is a chart illustrating an analysis process performed by the analyzer in FIG. 9, in accordance with embodiments of the present invention.

In exchange for these degraded levels of in-band signal quality, a range of reductions in peak-to-RMS ratio can be obtained, as shown in FIG. 10. For example, for a desired peak amplitude d=1.5, RHO exceeds 0.98 and the peak-to-RMS ratio at the $99.9^{th}$ percentile is 4.6 dB. When compared with the original peak-to-RMS ratio in z(t) of 8.1 dB at the $99.9^{th}$ percentile, it is clear in this example that the present invention has reduced the peak-to-RMS ratio by 3.5 dB with no degradation of the out-of-band signal quality, and minimal degradation of the in-band signal quality. Such a large reduction in peak-to-RMS ratio facilitates improved power efficiency and/or higher average power output capability by an amplifier, as will be appreciated by those skilled in amplifier design.

Figure 11:
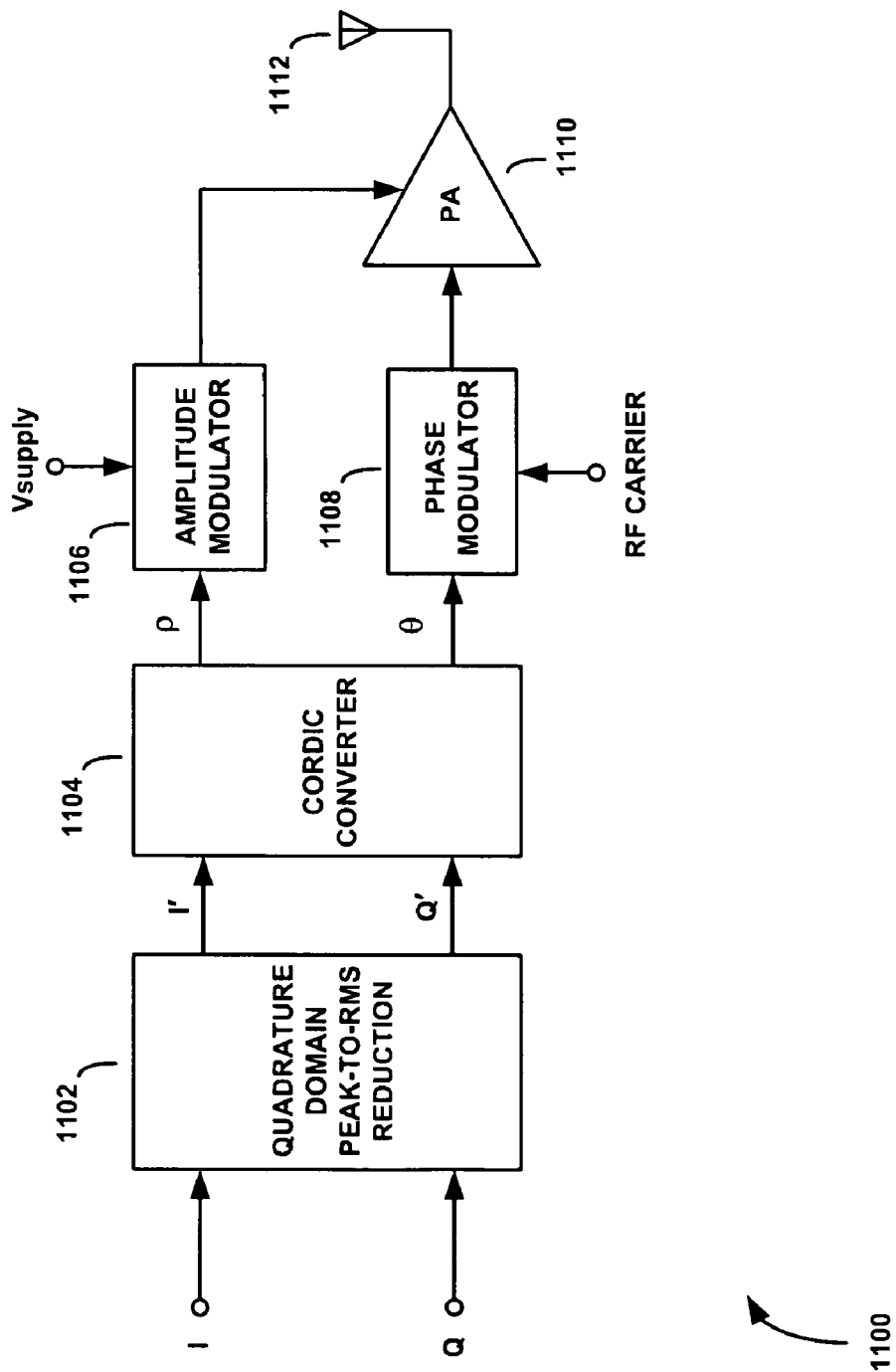
FIG. 11 is a block diagram of a polar modulation transmitter that is adapted to reduce the peak-to-RMS amplitude ratio of signals in the quadrature domain, according to an embodiment of the present invention.

According to another embodiment of the invention, the methods of reducing peak-to-RMS amplitude ratio are advantageously employed in a polar modulation transmitter. FIG. 11 is a drawing of a polar modulation transmitter 1100 which is adapted to reduce the peak-to-RMS amplitude ratio in the quadrature domain. The polar modulation transmitter 1100 comprises a quadrature domain peak-to-RMS reduction block 1102; a rectangular-to-polar converter 1104 implemented using a Coordinate Rotation Digital Computer (CORDIC) algorithm; an amplitude modulator 1106 configured in an amplitude modulation (AM) path; a phase modulator 1108 configured in a phase modulation (PM) path; a power amplifier (PA) 1110; and an antenna 1112.

During operation, the quadrature domain peak-to-RMS reduction block 1102 modifies in-phase (I) and quadrature phase (Q) signals received from a baseband processor (not shown) to produce modified I' and Q' signals having a reduced peak-to-RMS amplitude ratio. The CORDIC converter 1104 converts the modified I' and Q' from rectangular coordinates to polar coordinates, thereby producing an amplitude modulation signal ρ and an angle modulation signal θ. The amplitude and phase modulation signals ρ and θ may comprise analog waveforms, or may comprise time sampled waveforms having digital levels representing the amplitude and phase.

The AM path of the polar modulation transmitter 1100 is configured to receive the amplitude modulation signal ρ containing the envelope information of the original baseband modulation. The amplitude modulator 1106 operates to modulate a direct current (DC) power supply signal Vsupply according to the time varying envelope information in the amplitude modulation signal ρ. The resulting amplitude modulated power supply signal is coupled to the power supply port of the PA 1110.

The PM path is configured to receive the angle modulation signal θ, which contains the angle information of the original baseband modulation. The phase modulator 1108 operates to modulate a radio frequency (RF) carrier according to the time varying angle information in the angle modulation signal θ. The resulting phase modulated RF carrier is coupled to the RF input of the PA 1110.

The PA 1110 is configured to operate in its nonlinear region of operation, where it is efficient at converting DC power from the DC power supply Vsupply to RF power at the output of the PA 1110. According to one embodiment, the PA 1110 is implemented as a Class D, E or F switch-mode PA 1110 operating in compression, so that the output power of the PA 1110 is directly controlled by the amplitude modulated power supply signal applied to the power supply port of the PA 1110. The output of the PA 1110 is an amplitude- and phase-modulated RF carrier containing the original information-bearing modulation. After being amplified by the PA 1110, the amplitude- and phase modulated RF carrier is fed to the antenna 1112, which radiates the modulated RF carrier over the air to a remote receiver.

Figure 12:
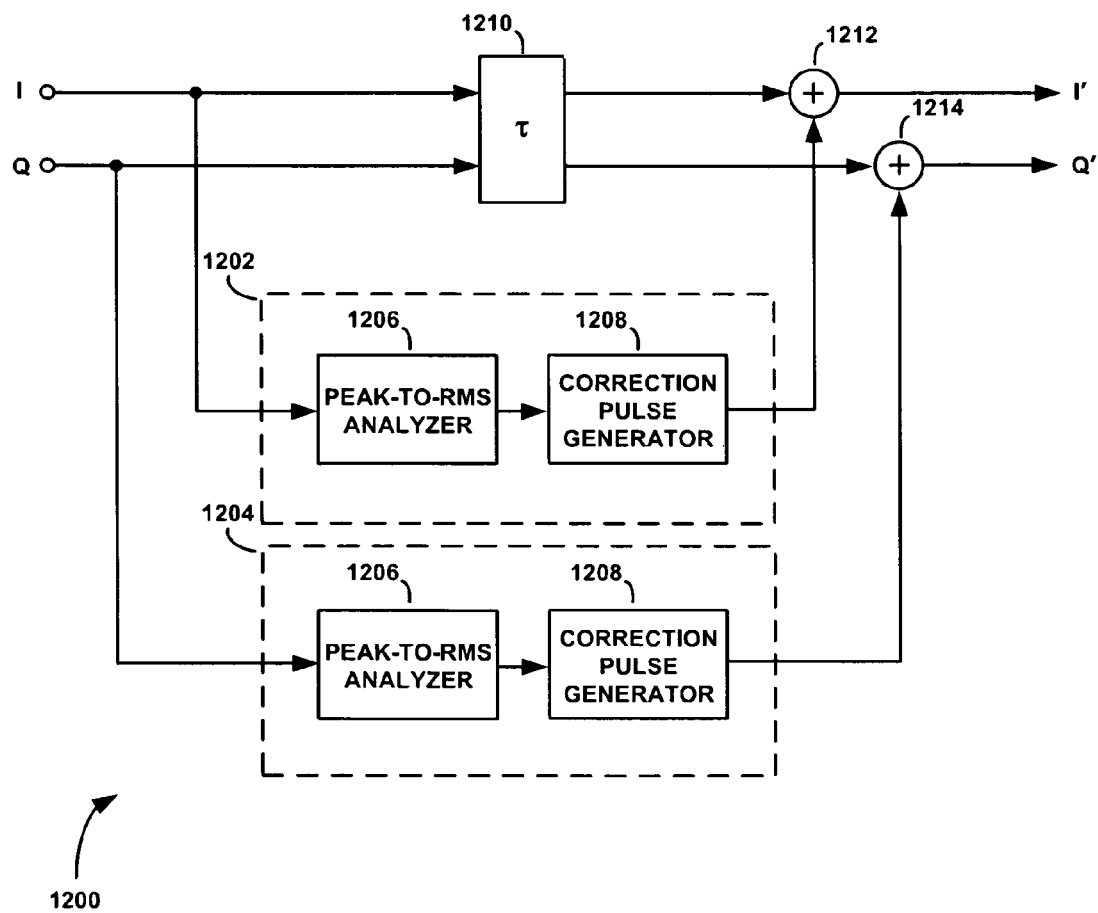
FIG. 12 is block diagram of a quadrature domain peak-to-RMS amplitude ratio reduction circuit, which may be used to implement the quadrature domain peak-to-RMS reduction block of the polar modulation transmitter in FIG. 11.

FIG. 12 is a block diagram of a peak-to-RMS amplitude ratio reduction circuit 1200, which may be used to implement the quadrature domain peak-to-RMS reduction block 1102 of the polar modulation transmitter 1100 in FIG. 11. The peak-to-RMS amplitude ratio reduction circuit 1200 includes a main path configured to receive the I and Q signals, first and second pulse injectors 1202 and 1204, similar to the pulse injector 120 used in the PAM signal generator 100 in FIG. 2 above. The first and second pulse injectors 1202 and 1204 both include a peak-to-RMS analyzer 1206 and a correction pulse generator 1208. The peak-to-RMS analyzers 1206 monitor the amplitudes of the I and Q signals to determine times or time intervals in which the amplitude of either signal exceeds a predetermined threshold. The correction pulse generators 1208 operate to inject correction pulses in either or both the I and Q signals for the times when the amplitudes of the signals exceed the predetermined threshold. The correction pulses are injected into the unmodified I and Q signals in the main signal path via the first and second summers 1212 and 1214, thereby producing the modified I' and Q' signals having reduced peak-to-RMS amplitude ratios. The delay element 1210 in the main signal path accounts for the delay needed to perform the peak-to-RMS reduction, thereby ensuring the correction pulses are combined with the unmodified I and Q signals at the appropriate times.

Figure 13:
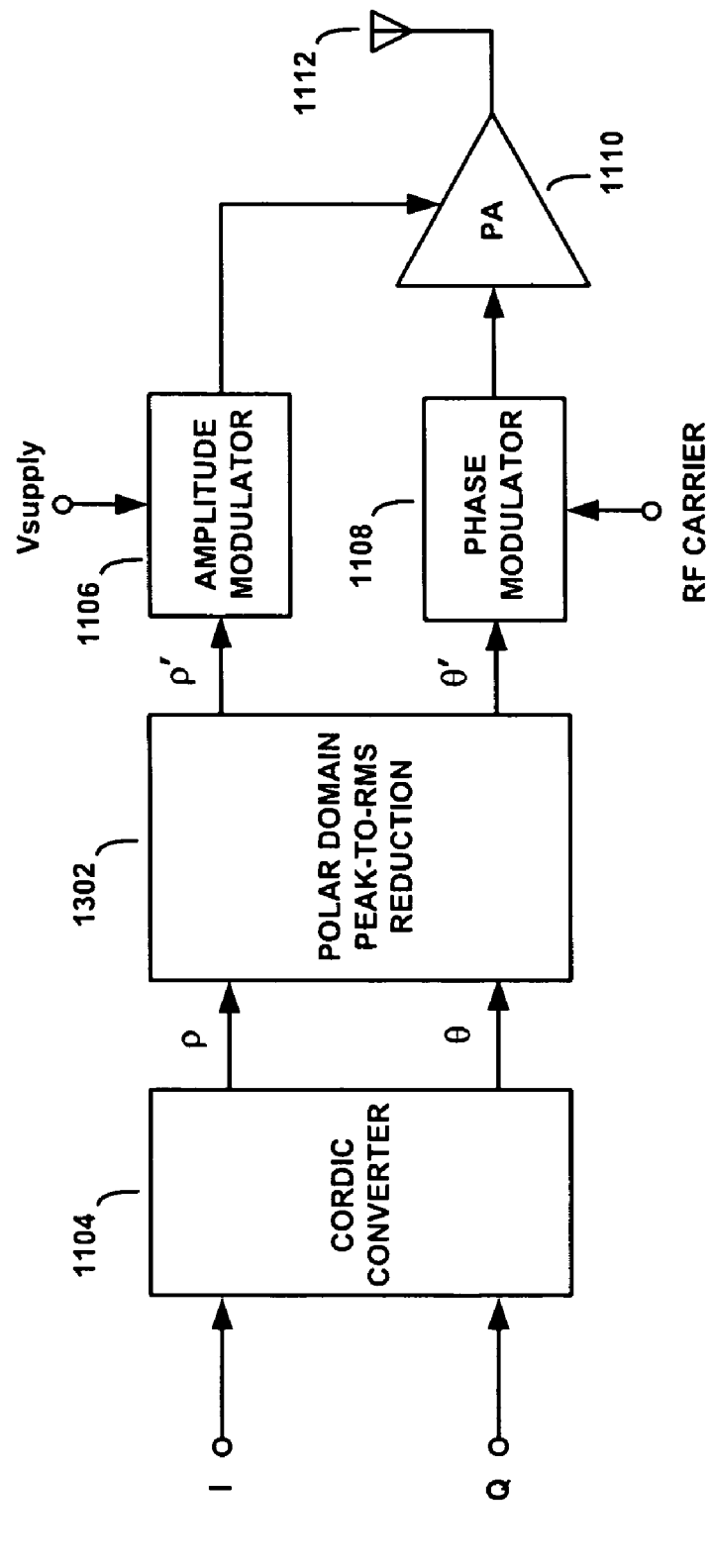
FIG. 13 is a block diagram of a polar modulation transmitter that is adapted to reduce the peak-to-RMS amplitude ratio of signals in the polar domain, according to an embodiment of the present invention.

Peak-to-RMS amplitude ratio reduction may also be performed in the polar domain, after the I and Q signals have been converted to polar coordinates. This approach, which is illustrated in FIG. 13, may be advantageously used in situations where the rectangular-to-polar conversion process performed by the CORDIC converter 1104 results in substantial bandwidth expansion of the amplitude and angle modulation signals ρ and θ. In FIG. 13 the polar modulation transmitter 1300 operates similar to the polar modulation transmitter 1100 in FIG. 11, except that peak-to-RMS amplitude ratio reduction is performed by a polar domain peak-to-RMS reduction block 1302 following the CORDIC converter 1104.

Figure 14:
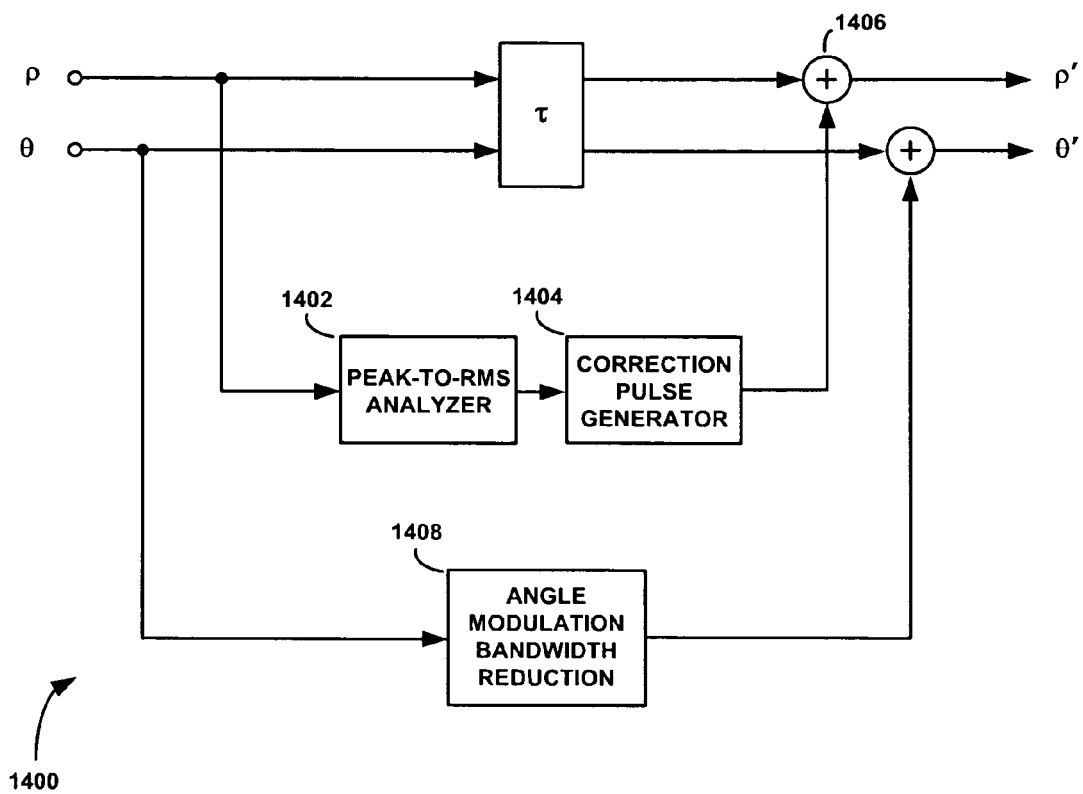
FIG. 14 is block diagram of a polar domain peak-to-RMS amplitude ratio reduction circuit, which may be used to implement the polar domain peak-to-RMS reduction block of the polar modulation transmitter in FIG. 13.

FIG. 14 is a block diagram of a polar domain peak-to-RMS amplitude ratio reduction circuit 1400, which may be used to implement that polar domain peak-to-RMS reduction block 1302 in the polar modulation transmitter 1300 in FIG. 13. The polar domain peak-to-RMS reduction circuit 1400 includes a peak-to-RMS analyzer 1402 and correction pulse generator 1404. The peak-to-RMS analyzer 1402 operates to monitor the envelope information in the amplitude modulation signal ρ, to determine when the amplitude exceeds a predetermined threshold. The pulse generator 1404 generates correction pulses that are combined with the amplitude modulation signal ρ in the main amplitude modulation path via a first summer 1406, to produce a modified amplitude modulation signal ρ' representing a reduced peak-to-RMS amplitude.

The polar domain peak-to-RMS amplitude ratio reduction circuit 1400 in FIG. 14 also includes an angle modulation bandwidth reduction block 1408, which can be employed to reduce the bandwidth of the angle information contained in the angle modulation signal θ in the PM path of the polar modulation transmitter 1300. The angle modulation bandwidth reduction block 1408 generates correction pulses that reduce the bandwidth of angle information in the angle modulation signal θ for angles or sample-to-sample angle changes that exceed a predetermined angle or angle change threshold. A nonlinear filtering technique that may be used to implement the angle modulation bandwidth reduction block 1408 is described in U.S. Pat. No. 7,054,385, which is hereby incorporated by reference.

Figure 15:
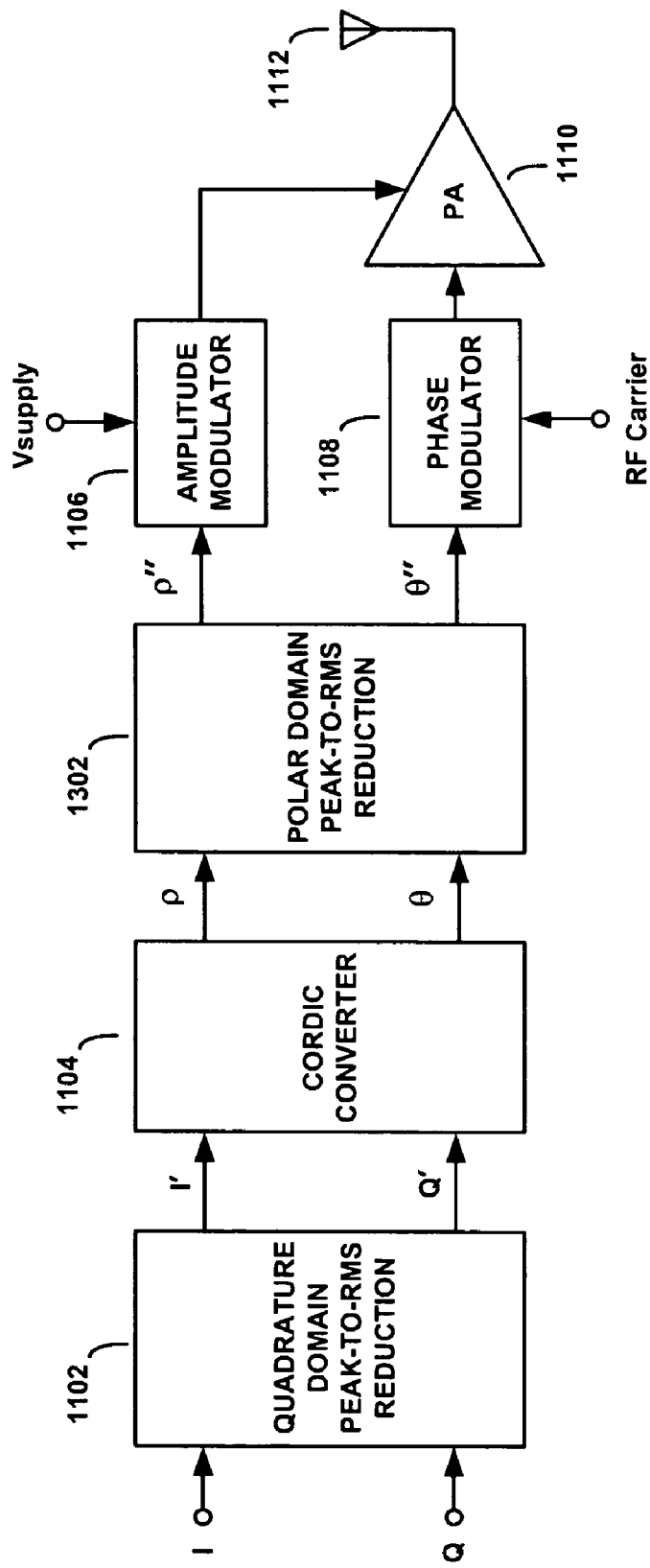
FIG. 15 is a block diagram of a polar modulation transmitter that is adapted to reduce the peak-to-RMS amplitude ratio of signals in both the quadrature domain and the polar domain, according to an embodiment of the present invention.

The quadrature domain peak-to-RMS amplitude ratio reduction approach shown and described in FIGS. 11 and 12 and the polar domain peak-to-RMS amplitude ratio reduction approach shown and described in FIGS. 13 and 14 may be applied individually, as described above, or in combination. FIG. 15 illustrates, for example, how the quadrate domain peak-to-RMS reduction block 1102 in FIG. 11 and the polar domain peak-to-RMS reduction block 1302 in FIG. 13 are combined to provide peak-to-RMS amplitude ratio reduction both prior to and after the rectangular-to-polar conversion process performed by the CORDIC converter 11104.

Figure 16A:
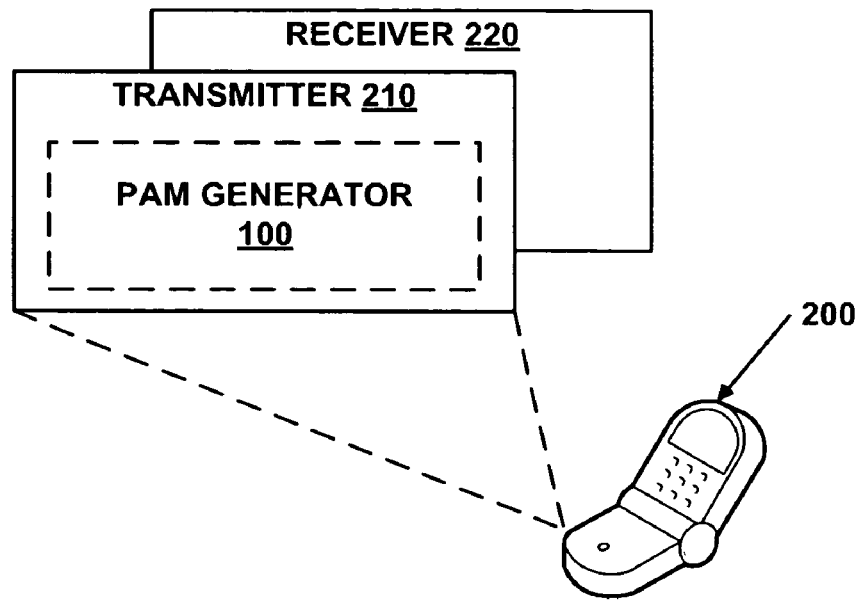
FIG. 16A is a diagram illustrating how the PAM signal generator in FIG. 2 or polar modulation transmitters with peak-to-RMS amplitude reduction in FIGS. 11, 13 and 15 may be used in a wireless handset, according to an embodiment of the present invention.
Figure 16B:
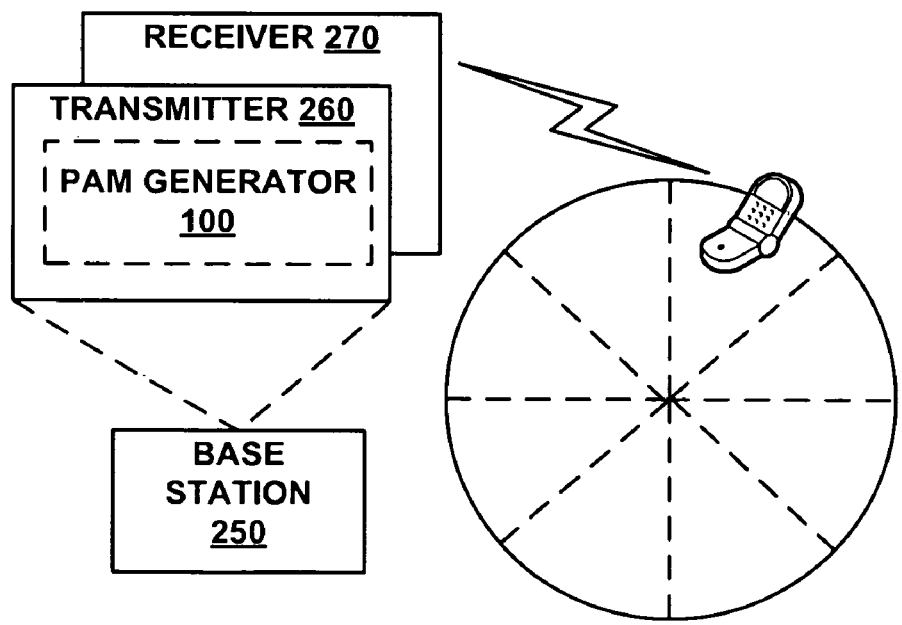
FIG. 16B is a diagram illustrating how the PAM signal generator in FIG. 2 or polar modulation transmitters with peak-to-RMS amplitude reduction in FIGS. 11, 13 and 15 may be used in a basestation of a cellular communications network, according to an embodiment of the present invention.

In accordance with the present invention the PAM signal generator 100 in FIG. 1 and the polar modulation transmitters 1100, 1300 and 1500 with peak-to-RMS reduction in FIGS. 11, 13 and 15 have application in wireless communication systems. For example, in wireless communication systems that use code division multiple access (CDMA) according to the IS-95 standard, the reverse channel that is transmitted by the handset is nominally defined to use offset quadrature phase shift keying (OQPSK) modulation. However, to accommodate higher data rates, the IS-95 standard allows so-called supplementary code channels. Thus, the signal to be transmitted is actually a sum of OQPSK signals. Unlike the nominally defined signal which has a relatively small peak-to-RMS ratio, the signal arising from supplementary code channels can have a very high peak-to-RMS ratio. This makes it difficult for conventional approaches to produce the average power needed for good reception at the receiver while maintaining acceptable in-band signal quality (RHO) and out-of-band signal quality (PSD). These problems and limitations are avoided and overcome by employing the PAM signal generator 100 or the polar modulation transmitters 1100, 1300 and 1500 with peak-to-RMS reduction FIGS. 11, 13 and 15 of the present invention. FIG. 16A illustrates, for example, how the PAM signal generator 100 may be configured in the transmitter 210 of a mobile handset 200. Alternatively, one of the polar modulation transmitters 1100, 1300 and 155 with peak-to-RMS reduction in FIG. 11, 13 or 15 may be used to implement the transmitter 210. FIG. 11B shows, another example, how the PAM generator 100 may be configured in the transmitter 260 of a basestation 250 of a cellular or other wireless communications network. Similar to the handset in FIG. 16A, one of the polar modulation transmitters 1100, 1300 and 1500 with peak-to-RMS reduction in FIG. 11, 13 or 15 may be alternatively used to implement the transmitter 260 of the basestation 250.

The present invention has been described with reference to specific exemplary embodiments. These specific exemplary embodiments are merely illustrative, and are not meant to restrict the scope or applicability of the present invention in any way. Various modifications or changes to the specific exemplary embodiments will also be suggested to those of ordinary skill in the art. For these reasons, the spirit and scope of the present invention should be construed as being limited only by the terms of the appended claims.

What is claimed is:

1. A method of reducing the peak-to-RMS (Root Mean Square) amplitude ratio of an amplitude modulation signal in a polar modulation transmitter, comprising:
    receiving in-phase (I) and quadrature phase (Q) signals;
    determining times or time intervals in which amplitudes represented in the I and Q signals exceed a quadrature domain maximum amplitude threshold;
    combining quadrature domain amplitude correction pulses with said I and Q signals to remove amplitude events determined to exceed said quadrature domain maximum amplitude threshold, thereby producing modified I and Q signals having reduced peak-to-RMS amplitude ratios;
    converting the modified I and Q signals to polar-coordinate amplitude and angle modulation signals;
    determining times or time intervals in which the amplitude represented in said amplitude modulation signal exceeds a polar domain maximum amplitude threshold;
    combining polar domain amplitude correction pulses with said amplitude modulation signal to reduce the amplitude of the amplitude modulation signal during times or time intervals the amplitude represented in said amplitude modulation signal is determined to exceed said polar domain maximum amplitude threshold, thereby producing a modified amplitude modulation signal;
    generating a modified amplitude modulated power supply signal from said modified amplitude modulation signal and an angle modulated carrier signal from said angle modulation signal; and
    amplifying the angle modulated carrier signal according to amplitude variations in said modified amplitude modulated power supply signal.

2. The method of claim 1, further comprising reducing the bandwidth of the angle modulation signal prior to generating the angle modulated carrier signal from said angle modulation signal.

3. A method of reducing the peak-to-RMS (Root Mean Square) amplitude ratio of an amplitude modulation signal in a polar modulation transmitter, comprising:
    receiving in-phase (I) and quadrature phase (Q) signals;
    converting the I and Q signals to polar-coordinate amplitude and angle modulation signals;
    determining times or time intervals in which the amplitude represented in said amplitude modulation signal exceeds a polar domain maximum amplitude threshold;

combining polar domain amplitude correction pulses with said amplitude modulation signal to reduce the amplitude of the amplitude modulation signal during times or time intervals when it is determined that the amplitude represented in said amplitude modulation signal exceeds the polar domain maximum amplitude threshold, thereby producing a modified amplitude modulation signal;

generating an amplitude modulated power supply signal from said modified amplitude modulation signal, and an angle modulated carrier signal from said angle modulation signal; and amplifying the angle modulated carrier signal according to amplitude variations in the amplitude modulated power supply signal.

4. The method of claim 3, further comprising reducing the bandwidth of the angle modulation signal prior to generating the angle modulated carrier signal from said angle modulation signal.

5. A polar modulation transmitter, comprising:

a quadrature domain peak-to-RMS reduction circuit configured to receive in-phase (I) and quadrature phase (Q) signals and generate modified I and Q signal having reduced peak-to-RMS amplitude ratios;

a rectangular-to-polar converter configured to convert said modified I and Q signals to polar-coordinate amplitude and angle modulation signals;

an amplitude modulator configured to amplitude modulate a direct current power supply according to amplitude variations represented in said amplitude modulation signal, to produce an amplitude modulated power supply signal;

an angle modulator configured to angle modulate a carrier signal according to angle variations represented in said angle modulation signal, to produce an angle modulated carrier signal;

a power amplifier configured to amplify said angle modulated carrier signal according to amplitude variations in said amplitude modulated power supply signal; and wherein the quadrature domain peak-to-RMS reduction circuit comprises:

a main signal path configured to receive said I and Q signals;

an in-phase correction path coupled in parallel with said main signal path including a first quadrature domain peak-to-RMS analyzer and a first quadrature domain correction pulse generator, said first quadrature domain peak-to-RMS analyzer operable to determine times or time intervals in which the amplitude of the I signal exceeds a quadrature domain maximum amplitude threshold, and said first quadrature domain correction pulse generator operable to provide quadrature domain in-phase correction pulses to a summer to combine the quadrature domain in-phase correction pulses with said I signal in said main signal path to remove amplitude events in said I signal determined to exceed said quadrature domain maximum amplitude threshold; and a quadrature phase correction path coupled in parallel with said main signal path including a second quadrature domain peak-to-RMS analyzer and a second quadrature domain correction pulse generator, said second quadrature domain peak-to-RMS analyzer operable to determine times or time intervals in which the amplitude of the Q signal exceeds said quadrature domain maximum amplitude threshold, and said second quadrature domain correction pulse generator operable to provide quadrature domain quadrature phase correction pulses to a second summer to combine the quadrature domain quadrature correction pulses with said Q signal in said main signal path to remove amplitude events in said Q signal determined to exceed said quadrature domain maximum amplitude threshold.

6. The polar modulation transmitter of claim 5 wherein the quadrature domain peak-to-RMS reduction circuit comprises a quadrature of domain nonlinear filter.

7. The polar modulation transmitter of claim 5, further comprising a polar domain nonlinear filter configured to receive said polar-coordinate amplitude modulation signal from said rectangular-to-polar converter and generate a peak-to-RMS reduced amplitude modulation signal.

8. The polar modulation transmitter of claim 7 wherein said polar domain nonlinear filter includes a polar domain peak-to-RMS reduction circuit having:

a main signal path configured to receive said the amplitude modulation signal from said rectangular-to-polar converter; and an amplitude correction path coupled in parallel with said main signal path including a polar domain peak-to-RMS analyzer and a polar domain correction pulse generator, wherein said polar domain peak-to-RMS analyzer is operable to determine times or time intervals in which the amplitude of the amplitude modulation signal exceeds a polar domain maximum amplitude threshold, and said polar domain correction pulse generator is operable to provide polar domain correction pulses to a summer to combine the polar domain correction pulses with said amplitude modulation signal in said main signal path to remove amplitude events in said amplitude modulation signal determined to exceed said polar domain maximum amplitude threshold.

9. The polar modulation transmitter of claim 8 wherein said polar domain nonlinear filter further includes an angle correction path including an angle modulation bandwidth reduction circuit configured to reduce the bandwidth of said angle modulation signal before it is used by said angle modulator to angle modulate said carrier signal.

10. A polar modulation transmitter, comprising:

a rectangular-to-polar converter configured to convert in-phase (I) and quadrature phase (Q) signals to polar-coordinate amplitude and angle modulation signals;

a polar domain peak-to-RMS (Root Mean Square) reduction circuit configured to receive said amplitude modulation signal and generate a peak-to-RMS reduced amplitude modulation signal;

an amplitude modulator configured to amplitude modulate a direct current power supply according to amplitude variations represented in said peak-to-RMS reduced amplitude modulation signal, to produce an amplitude modulated power supply signal;

an angle modulator configured to angle modulate a carrier signal according to angle variations represented in said angle modulation signal, to produce an angle modulated carrier signal; and a power amplifier configured to amplify said angle modulated carrier signal according to amplitude variations in said amplitude modulated power supply signal.

11. The polar modulation transmitter of claim 10 wherein the polar domain peak-to-RMS reduction circuit comprises a polar domain nonlinear filter.

12. The polar modulation transmitter of claim 10 wherein the polar domain peak-to-RMS reduction circuit comprises:

a main signal path configured to receive said the amplitude modulation signal from said rectangular-to-polar converter; and an amplitude correction path coupled in parallel with said main signal path including a polar domain peak-to-RMS analyzer and a polar domain correction pulse generator, wherein said polar domain peak-to-RMS analyzer is operable to determine times or time intervals in which the amplitude of the amplitude modulation signal exceeds a polar domain maximum amplitude threshold, and said polar domain correction pulse generator is operable to provide polar domain correction pulses to a summer to combine the polar domain correction pulses with said amplitude modulation signal in said main signal path to remove amplitude events in said amplitude modulation signal determined to exceed said polar domain maximum amplitude threshold.

13. The polar modulation transmitter of claim 12 wherein said polar domain nonlinear filter further includes an angle correction path including an angle modulation bandwidth reduction circuit configured to reduce the bandwidth of said angle modulation signal before it is used by said angle modulator to angle modulate said carrier signal.

14. A polar modulation transmitter, comprising:
a quadrature domain peak-to-RMS (Root Mean Square) reduction circuit configured to receive in-phase (I) and quadrature phase (Q) signals and generate modified I and Q signal having reduced peak-to-RMS amplitude ratios;
a rectangular-to-polar converter configured to convert said modified I and Q signals to polar-coordinate amplitude and angle modulation signals;
a polar domain nonlinear filter configured to receive said polar-coordinate amplitude modulation signal from said rectangular-to-polar converter and generate a peak-to-RMS reduced amplitude modulation signal;
an amplitude modulator configured to amplitude modulate a direct current power supply according to amplitude variations represented in said reduced amplitude modulation signal, to produce an amplitude modulated power supply signal;
an angle modulator configured to angle modulate a carrier signal according to angle variations represented in said angle modulation signal, to produce an angle modulated carrier signal; and
a power amplifier configured to amplify said angle modulated carrier signal according to amplitude variations in said amplitude modulated power supply signal,
wherein the polar domain nonlinear filter has:
a main signal path configured to receive said amplitude modulation signal from said rectangular-to-polar converter; and
an amplitude correction path coupled in parallel with said main signal path including a polar domain peak-to-RMS analyzer and a polar domain correction pulse generator,
wherein said polar domain peak-to-RMS analyzer is operable to determine times or time intervals in which the amplitude of the amplitude modulation signal exceeds a polar domain maximum amplitude threshold, and said polar domain correction pulse generator is operable to provide polar domain correction pulses to a summer to combine the polar domain correction pulses with said amplitude modulation signal in said main signal path to remove amplitude events in said amplitude modulation signal determined to exceed said polar domain maximum amplitude threshold.

15. The polar modulation transmitter of claim 14 wherein said polar domain nonlinear filter further includes an angle correction path including an angle modulation bandwidth reduction circuit configured to reduce the bandwidth of said angle modulation signal before it is used by said angle modulator to angle modulate said carrier signal.

* * * * *